United States Patent
Ripley

(10) Patent No.: US 10,174,422 B2
(45) Date of Patent: Jan. 8, 2019

(54) APPARATUS FOR SELECTIVE GAS INJECTION AND EXTRACTION

(71) Applicant: APPLIED MATERIALS, INC., Santa Clara, CA (US)

(72) Inventor: Martin J. Ripley, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 130 days.

(21) Appl. No.: 14/052,049

(22) Filed: Oct. 11, 2013

(65) Prior Publication Data

US 2014/0120257 A1 May 1, 2014

Related U.S. Application Data

(60) Provisional application No. 61/718,413, filed on Oct. 25, 2012.

(51) Int. Cl.
*C23C 16/455* (2006.01)
*C23C 16/44* (2006.01)

(52) U.S. Cl.
CPC ........ *C23C 16/455* (2013.01); *C23C 16/4412* (2013.01); *C23C 16/45544* (2013.01); *C23C 16/45578* (2013.01); *Y10T 137/86083* (2015.04)

(58) Field of Classification Search
CPC .............. C23C 16/4412; C23C 16/455; C23C 16/45578; C23C 16/45544;
(Continued)

(56) References Cited

U.S. PATENT DOCUMENTS

| 5,522,412 A | 6/1996 | Ohba et al. |
| 5,781,693 A | 7/1998 | Ballance et al. |

(Continued)

FOREIGN PATENT DOCUMENTS

| JP | 11-111692 A | 4/1999 |
| JP | 2000-262351 A | 4/2000 |

(Continued)

OTHER PUBLICATIONS

International Search Report and Written Opinion dated Feb. 12, 2014 for PCT Application No. PCT/US2013/065354.

(Continued)

*Primary Examiner* — Rudy Zervigon
(74) *Attorney, Agent, or Firm* — Moser Taboada; Alan Taboada

(57) ABSTRACT

Methods and apparatus for selective gas injection and extraction for use in a substrate processing chamber are provided herein. In some embodiments, a gas injection and extraction apparatus includes a plate having a plurality of apertures through a thickness of the plate, each aperture of the plurality of apertures having an aperture wall; a plurality of tubes, each tube partially disposed within one of the plurality of apertures, wherein a disposed portion of each of the tubes is spaced apart from at least a portion of the aperture wall of the aperture in which it is disposed, thereby forming an interstice between at least a portion of the aperture wall and the disposed portion of the tube; a gas supply fluidly coupled to each of the tubes; and a vacuum source fluidly coupled to each of the interstices.

17 Claims, 6 Drawing Sheets

(58) Field of Classification Search
CPC ......... C23C 16/45563; C23C 16/45574; Y10T 137/86083
See application file for complete search history.

(56) References Cited

U.S. PATENT DOCUMENTS

| | | | |
|---|---|---|---|
| 6,086,677 | A | 7/2000 | Umotoy et al. |
| 6,565,655 | B2 | 5/2003 | Hwang et al. |
| 6,890,403 | B2 | 5/2005 | Cheung et al. |
| 8,025,731 | B2 | 9/2011 | Ni et al. |
| 8,057,601 | B2 | 11/2011 | Koelmel et al. |
| 8,057,602 | B2 | 11/2011 | Koelmel et al. |
| 8,111,978 | B2 | 2/2012 | Sorabji et al. |
| 8,298,372 | B2 | 10/2012 | Kim et al. |
| 9,051,647 | B2 | 6/2015 | Cooperberg et al. |
| 2003/0049372 | A1* | 3/2003 | Cook ............ C23C 16/24 427/248.1 |
| 2004/0067641 | A1* | 4/2004 | Yudovsky ........ C23C 16/4412 438/680 |
| 2009/0304924 | A1 | 12/2009 | Gadgil |
| 2010/0037820 | A1* | 2/2010 | Lee ............ C23C 16/45551 118/719 |
| 2011/0212625 | A1* | 9/2011 | Toyoda ........... C23C 16/4412 438/758 |
| 2013/0019803 | A1 | 1/2013 | Samir et al. |
| 2014/0027060 | A1 | 1/2014 | Ranish et al. |
| 2014/0030433 | A1 | 1/2014 | Ranish |

FOREIGN PATENT DOCUMENTS

| | | |
|---|---|---|
| JP | 2001-162351 A | 9/2001 |
| JP | 2008-013782 A | 1/2008 |
| JP | 2009-149989 A | 7/2009 |
| KR | 10-2007-0058797 A | 11/2007 |
| KR | 10-0980525 B1 | 9/2010 |

OTHER PUBLICATIONS

Search Report from The State Intellectual Property Office of The People's Republic of China for Chinese Application No. 2013800525200 dated Oct. 13, 2016.

* cited by examiner

APPARATUS FOR SELECTIVE GAS INJECTION AND EXTRACTION

CROSS-REFERENCE TO RELATED APPLICATIONS

This application claims benefit of U.S. provisional patent application Ser. No. 61/718,413, filed Oct. 25, 2012, which is herein incorporated by reference.

FIELD

Embodiments of the present invention generally relate to substrate processing systems, and more specifically, to gas injection and extraction apparatus for use in such substrate processing systems.

BACKGROUND

In substrate processing, reaction byproducts, for example formed from reactions of process gases provided to a substrate process chamber, are typically evacuated from the process chamber via an exhaust port. The exhaust port is typically disposed below a plane of the substrate being processed in the chamber on the floor or one or more sides of the process chamber. However, the inventor believes that by evacuating the reaction byproducts in such a manner, the reaction byproducts may be forced to flow across the top surface of the substrate. The inventor further believes that, as the reaction byproducts flow across the top surface of the substrate, the overall composition of process gases at various points across the substrate may be changed, thus changing the dynamics of subsequent reactions across the substrate, thereby causing process non-uniformities. The inventor also believes that this effect may be exacerbated at an edge of the substrate as the reaction by products accumulate as they flow across the substrate, thus providing a highest concentration of reaction byproducts proximate the edge of the substrate closest to the exhaust port.

Therefore, the inventor has provided an improved gas distribution apparatus for use in substrate processing apparatus.

SUMMARY

Methods and apparatus for selective gas injection and extraction for use in a substrate processing chamber are provided herein. In some embodiments, a gas injection and extraction apparatus includes a plate having a plurality of apertures through a thickness of the plate, each aperture of the plurality of apertures having an aperture wall; a plurality of tubes, each tube partially disposed within one of the plurality of apertures, wherein a disposed portion of each of the tubes is spaced apart from at least a portion of the aperture wall of the aperture in which it is disposed, thereby forming an interstice between at least a portion of the aperture wall and the disposed portion of the tube; a gas supply fluidly coupled to each of the tubes; and a vacuum source fluidly coupled to each of the interstices.

In some embodiments, a process chamber is provided and includes a chamber body enclosing a processing volume and having a substrate support disposed within the processing volume; and the gas injection and extraction apparatus as described in any of the embodiments disclosed herein disposed opposite the substrate support.

In some embodiments, a process chamber having a gas injection and extraction apparatus includes a chamber body enclosing a processing volume and having a substrate support disposed within the processing volume; a first gas injection and extraction apparatus disposed within the chamber body opposite a support surface of the substrate support; a first gas supply fluidly coupled to the first gas injection conduit to provide one or more gases to a region proximate to the substrate support; and a first vacuum source fluidly coupled to the first gas extraction conduit. The first gas injection and extraction apparatus includes a first gas injection conduit extending over at least a portion of the support surface of the substrate support; and a first gas extraction conduit adjacent to the first gas injection conduit and extending over at least a portion of the support surface of the substrate support;

In some embodiments, a method of processing a substrate disposed on a substrate support in a processing volume of a process chamber is provided and includes providing a first gas to the processing volume via a gas injection conduit extending over at least a portion of the substrate; removing at least some excess first gas and any process byproducts from the processing volume via a gas extraction conduit disposed adjacent to the gas injection conduit and extending over at least a portion of the substrate; providing a second gas to the processing volume via a second gas injection conduit extending over at least a portion of the substrate; and removing at least some excess second gas and any process byproducts from the processing volume via a second gas extraction conduit disposed adjacent to the first gas injection conduit and extending over at least a portion of the substrate.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of a selective gas injection and extraction apparatus for use in substrate processing systems, for example in semiconductor substrate processing systems, are provided herein. Embodiments of the inventive selective gas injection and extraction apparatus disclosed herein may be used in any suitable process chamber, including but not limited to those adapted for processes such as rapid thermal processing (RTP), chemical vapor deposition (CVD), epitaxial deposition, atomic layer deposition (ALD), and the like. Suitable process chambers include, but are not limited to, process chambers configured for RTP, CVD, ALD, epitaxial deposition, or the like, which are commercially available from Applied Materials, Inc of Santa Clara, Calif. It is contemplated that other process chambers may also benefit from the inventive selective gas injection and extraction apparatus in accordance with the teachings herein, including chambers configured for other processes and chambers made by other manufacturers.

Embodiments of the selective gas injection and extraction apparatus generally provide one or more gas extraction ports proximate to one or more gas injection ports such that gases provided by the gas injection ports may be extracted via proximate gas extraction ports, thereby avoiding flowing process gases and/or process byproducts across the surface of the substrate to an exhaust port location to a side of the substrate, as typically found in conventional process chambers. Various embodiments of the selective gas injection and extraction apparatus are discussed in greater detail, below.

Figure 1:
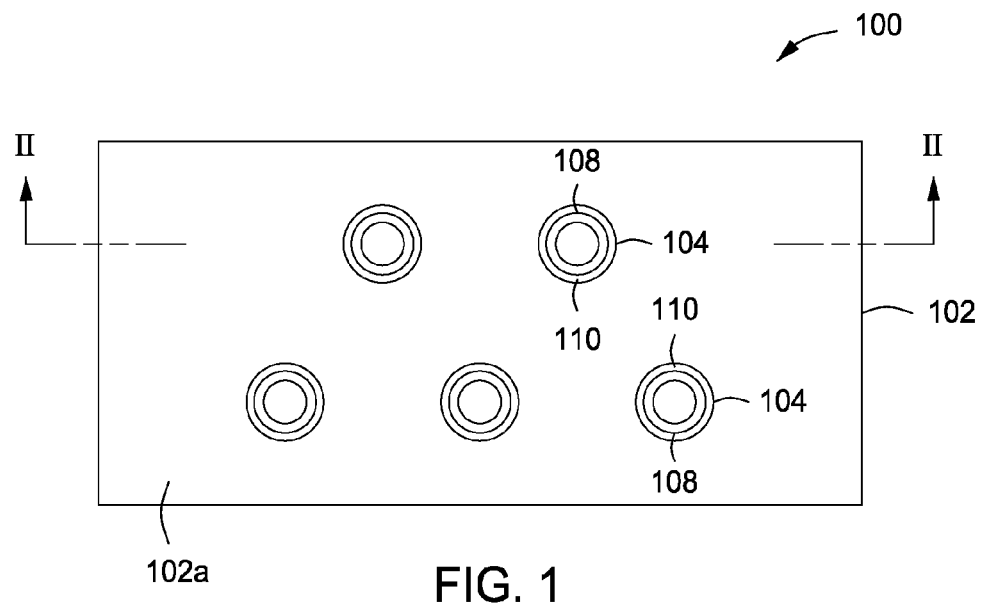
FIG. 1 depicts a plan view of a portion of a gas injection and extraction apparatus in accordance with some embodiments of the present invention.
Figure 2:
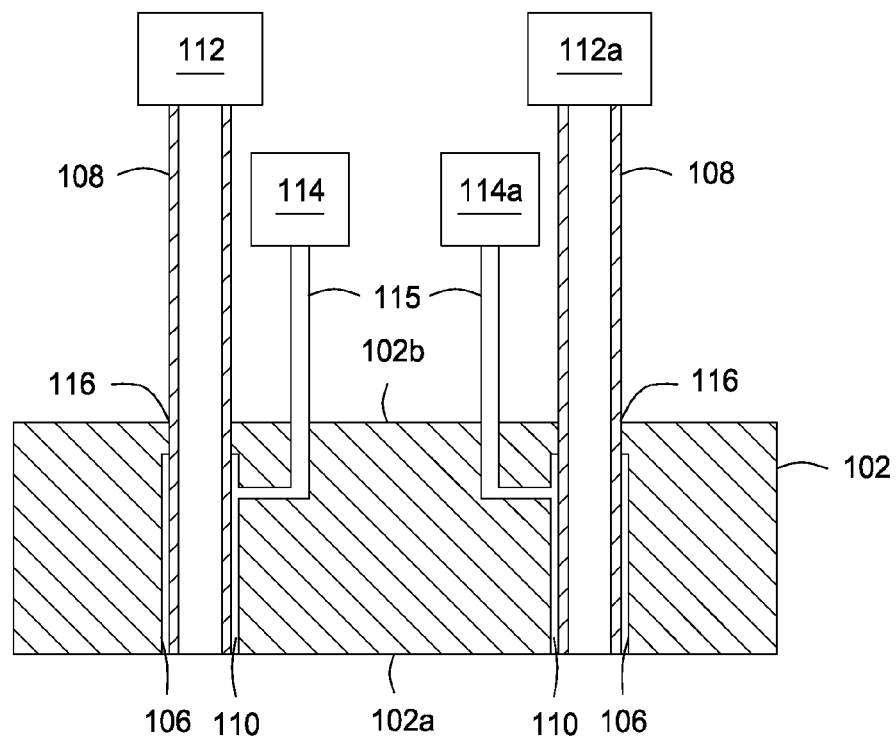
FIG. 2 depicts an enlarged cross sectional view of the apparatus of FIG. 1 taken along line II-II.

For example, FIG. 1 illustrates a partial plan view of a first side 102a of plate 102 suitable for use in a selective gas injection and extraction apparatus 100 in accordance with some embodiments of the present invention. In some embodiments, the selective gas injection and extraction apparatus 100 may generally comprise a plate 102 having a first side 102a and an opposing second side 102b (FIG. 2). A plurality of holes or apertures 104 are provided through the plate thickness between first and second sides 102a and 102b in a desired pattern. The desired pattern may be selected to provide a desired distribution of gases delivered to and extracted from a processing region between the plate 102 and a substrate disposed opposite the first side 102a of the plate 102. Apertures 104 comprise aperture walls 106 through the thickness of the plate 102. Apertures 104 are illustrated as having circular cross sections for ease of illustration only. Apertures 104 having other shapes may be used for some applications. Non-limiting exemplary aperture cross sections may include elliptical, triangular, square, hexagonal, or other curved and/or polygonal shapes. Apertures 104 may have varying cross sections along their length. Apertures 104 may vary in size or cross section within the same plate 102.

According to some embodiments, hollow tubular structures or tubes 108 are at least partially disposed within apertures 104 and spaced apart from at least a portion of aperture walls 106. For ease of illustration only, tubes 108 are illustrated as having circular cross sections. However, tubes 108 having other shapes may also be used. Non-limiting exemplary tube cross sections may include elliptical, triangular, square, hexagonal, or other curved and/or polygonal shapes. Tubes 108 may have varying cross sections along their length and may vary in size or cross section in the same embodiment. The cross sectional shape of the tubes 108 may be the same as, or substantially the same as, the aperture 104, or the cross sectional shape of the tubes 108 may be different than the cross sectional shape the apertures 104.

For clarity, tubes 108 are illustrated as substantially centered (e.g., coaxial positioning) within apertures 104 with a substantially uniform clearance or interstice 110 between the tubes 108 and aperture wall 106. However, tubes 108 need not be centered in the apertures 104 and interstices 110 need not be uniform (e.g., eccentric positioning). Portions of tube 108 may be closer to aperture walls 106 thereby reducing the size of the interstice 110 between that portion of the tube and the portion of the aperture wall 106 adjacent to the tube. A portion of tube 108 may contact a portion of aperture wall 106, eliminating or substantially eliminating the clearance or interstice 110 between that portion of the tube and the aperture wall 106. When the clearance or interstice 110 is reduced locally due to an eccentric position of the tube 108 with respect to the aperture 104, the interstice 110 between other portions of the tube 108 and the aperture walls 106 may increase.

Plate 102 and tube 108 may be fabricated from any material that is non-reactive to the process gases and/or process environment in which the plate 102 or tube 108 are used. For example, in some embodiments, the plate 102 or tube 108 may be fabricated from a metal (e.g., stainless steel, aluminum, or the like) or a ceramic (e.g., silicon nitride (SiN), alumina ($Al_2O_3$), or the like). Alternatively, in some embodiments, the plate 102 or tube 108 may be fabricated from a transparent material, for example, crystalline quartz ($SiO_2$), vitreous silicon oxide ($SiO_2$), transparent alumina ($Al_2O_3$) (e.g., sapphire), translucent alumina ($Al_2O_3$), yttrium oxide ($Y_2O_3$), or coated transparent ceramics. Additional examples of materials suitable for the present inventive selective gas injection and extraction apparatus are disclosed with respect to a transparent showerhead, used in an environment similar to the anticipated environment of the present invention, in U.S. Pat. No. 5,781,693, entitled "Gas Introduction Showerhead For An RTP Chamber With Upper And Lower Transparent Plates And Gas Flow Therebetween", issued Jul. 14, 1998, to David S. Balance, et al., and assigned to the assignee of the present application.

FIG. 2 is an enlarged cross sectional view of the gas injection and extraction apparatus 100 of FIG. 1 taken along line II-II according to some embodiments of the present invention. Tubes 108 may be fluidly coupled to gas supplies 112, 112a. As illustrated, each tube 108 is connected to a gas supply 112, 112a which may be a common gas supply to supply the same gas, or may be different gas supplies. In embodiments in which gas supplies 112, 112a supply different gases, the gases may differ in composition (for example different gases or mixtures of different gases), concentration of components, pressure, temperature, flow rate, or other measurable characteristic.

The gas or gases supplied by gas supplies 112, 112a may be those suitable for processing substrates, for example, in semiconductor device or other thin film fabrication techniques. For example, the gases may be one or more of a reactive gas (for example, for treating a substrate, depositing a material on a substrate, etching a substrate, etc.), a non-reactive gas (for example, for purging a processing volume containing the substrate, or the like), or combinations thereof.

In the embodiment illustrated in FIG. 2, tubes 108 are disposed within apertures 104 through the plate 102 from the second side 102b to the first side 102a, terminating at the first side 102a. In other embodiments, tubes 108 are disposed within aperture 104 from the second side 102b and may terminate at a position above the first side 102a (i.e., at a point spaced from the first side 102a toward the second side 102b), leaving a portion of the aperture 104 free of the tube. In other embodiments, tube 108 may extend from the second side 102b through aperture 104 and terminate at a point beyond the first side 102a.

Apertures 104 may be fluidly coupled to vacuum source 114, 114a. As illustrated in FIG. 2, each aperture 104 is connected to a vacuum source 114, 114a, which may be a common vacuum source or may be different vacuum sources. A vacuum source applied to aperture 104 may facilitate rapid and efficient removal of gases and other material, for example process byproducts, from the region above the substrate support, or, when a substrate is mounted on the substrate support, from the surface of the substrate.

FIG. 2 illustrates a non-limiting embodiment of the present invention in which vacuum sources 114, 114a are coupled to apertures 104. The apertures 104 are reduced in cross sectional area by the presence of tubes 108 disposed within the apertures 104. Therefore, the vacuum source 114 is effectively connected fluidly to the interstices 110 formed between the aperture walls 106 and the tubes 108.

In the embodiment illustrated, plate 102 comprises an area in which the aperture 104 has a reduced cross sectional area 116 proximate to the second side 102b. Reduced cross sectional area 116 may be configured to fluidly seal against a portion of tubes 108. Alternatively or in combination, an increased cross sectional area may be provided in a corresponding region of the tubes 108 to provide the seal. Alternatively or in combination, a gasket or other sealing material, such as an o-ring, may be provided between the plate 102 and the tubes 108 to facilitate providing a seal between the tubes 108 and the plate 102. A vacuum port 115 may fluidly couple the apertures 104 (effectively the interstice 110) to vacuum sources 114, 114a, for example to a vacuum pump or vacuum pumps, providing a direct link to between the aperture 104 (effectively the interstice 110) and the vacuum sources.

Figure 3:
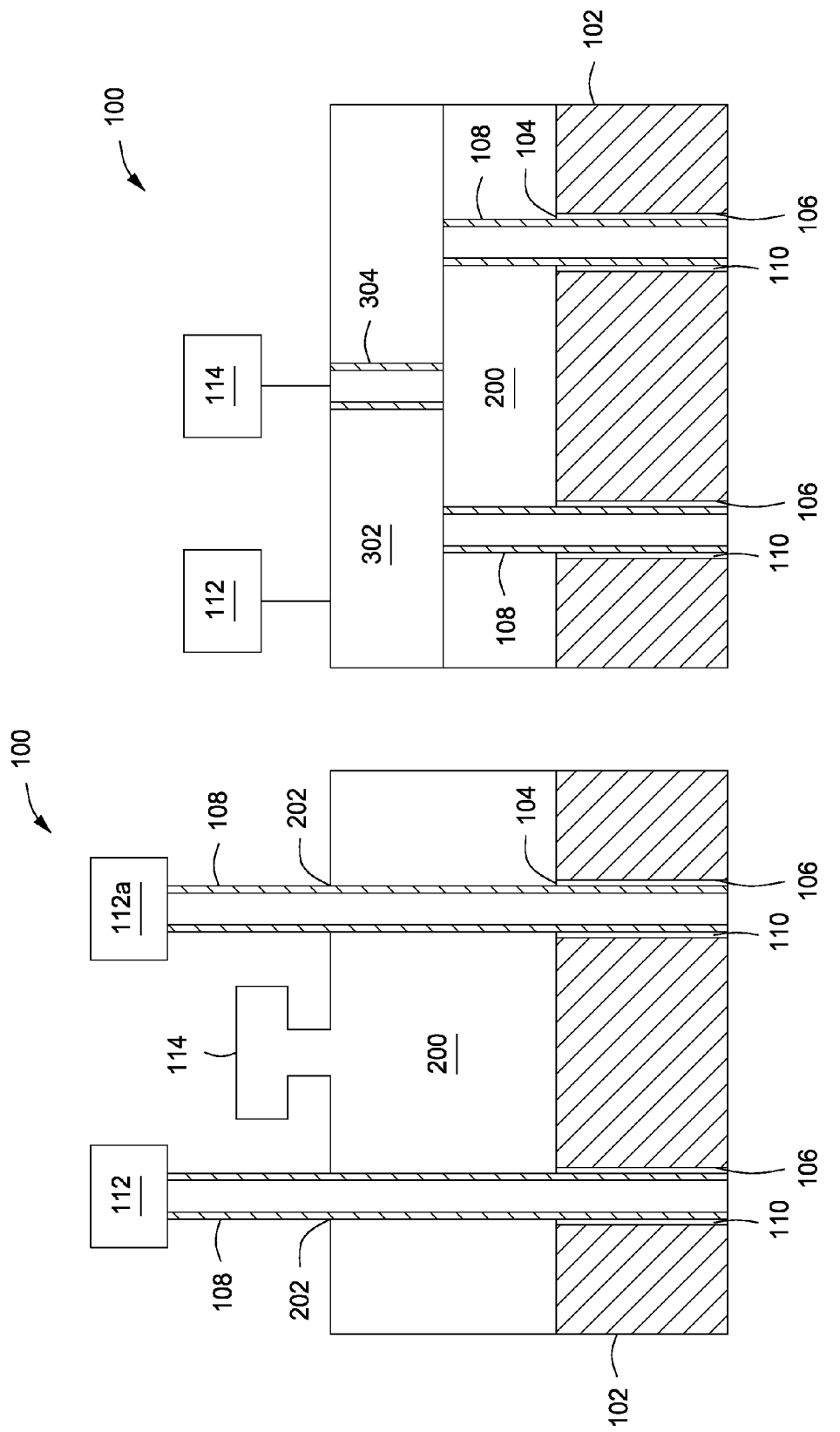
FIG. 3A depicts a cross sectional view of a gas injection and extraction apparatus in accordance with some embodiments of the present invention.
FIG. 3B depicts a cross sectional view of a gas injection and extraction apparatus in accordance with some embodiments of the present invention.

The coupling of a vacuum source 114 to apertures 104 illustrated in FIG. 2 is an exemplary configuration and should not be considered to be a limitation. Alternate exemplary configurations for coupling a vacuum source to an aperture are illustrated in FIGS. 3A-B. As illustrated in FIG. 3A, a plurality of apertures 104 are fluidly coupled to a plenum 200. Tubes 108 pass through the plenum and the plenum is fluidly sealed about the tubes 108, for example in the area 202 where the tubes 108 exit the plenum 200. The plenum 200 is in fluid communication with a vacuum source 114, such as a vacuum pump, which reduces the pressure within the plenum 200. Because the plenum 200 and apertures 104 are fluidly coupled, the vacuum source 114 provides a vacuum or reduced pressure to the apertures 104 connected to the plenum 200. Other configurations for fluidly connecting the apertures to a vacuum source are contemplated.

As shown in FIG. 3B, a plurality of apertures 104 are fluidly coupled to the plenum 200 (e.g., a first plenum), as described above, and a plurality of tubes 108 are fluidly coupled to a second plenum 302. The first and second plenums (200, 302) are isolated from each other within the gas injection and extraction apparatus 100. One or more tubes 304 (similar to tubes 108) may be provided to couple the vacuum source 114 to the first plenum 200. The gas supply 112 may be coupled to the second plenum 302 to provide one or more process gases to the tubes 108 via the second plenum 302.

Figure 4:
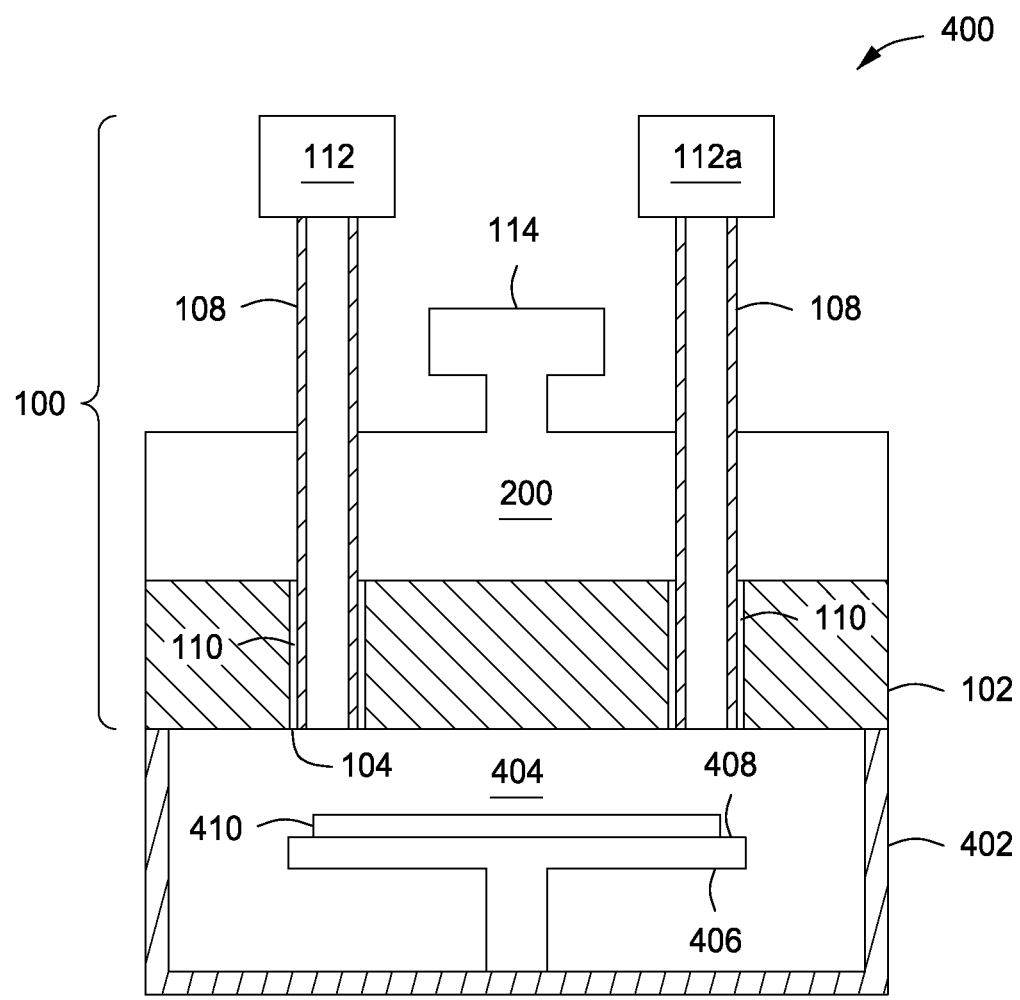
FIG. 4 depicts a cross sectional view of a process chamber comprising a gas injection and extraction apparatus in accordance with some embodiments of the present invention.

The inventive gas injection and extraction apparatus 100 may form a component of a process chamber 400, schematically illustrated in cross section in FIG. 4. Process chamber 400 comprises chamber body 402, enclosing a processing volume 404, and gas injection and extraction apparatus 100. The process chamber 400 may include a substrate support 406 for supporting a substrate thereon. Substrate support 406 may be mounted in the process chamber 400 for rotation, or may be mounted to the chamber to prevent rotation, or may be mounted for selective rotation.

As illustrated, tubes 108 are each connected to a gas supply 112, 112a. As above, gas supplies 112, 112a may provide the same or different gases, and, if supplying the same gas, may be a common gas supply.

As process gases are introduced to the process chamber 400, the process gases react with one another and/or with a substrate, for example a substrate 410 disposed in a substrate support surface 408 of the substrate support 406, forming, among other things, reaction byproducts. The reaction byproducts are evacuated from the processing volume 404 of the process chamber 400 via the interstices 110 formed between apertures 104 and tubes 108. The interstices 110 are formed surrounding, or at least partially surrounding, the tube 108.

Thus, tubes 108 and associated components comprise the gas injection portion of the disclosed gas injection and extraction apparatus 100 for providing one or more gases to the processing volume 404 to process the substrate 410. Apertures 104, or interstices 110, and associated components comprise the gas extraction portion of the gas injection and extraction apparatus 100, with the gas extraction portion removing the one or more gases and/or process byproducts from the processing volume 404 from a position opposing the surface of the substrate 410, thereby advantageously preventing or limiting the flow of process gases or process byproducts across the surface of the substrate 410.

In known process chambers, process gases are often introduced to the substrate from above the substrate, and react with the substrate, forming at least process byproducts. The process gases and the process byproducts are typically caused to flow to an exhaust located in the chamber side wall or below the substrate support. Without wishing to be bound by theory, the inventor believes that the described flow of reaction byproducts from the top surface of the substrate as in known processes may undesirably change the overall composition of gases at various points across the substrate, thereby impacting the reaction dynamics and affecting process gas reactions across the substrate, thus undesirably causing process non-uniformities. The inventor further believes that this effect may be exacerbated at an edge of the substrate as the reaction byproducts accumulate as they flow across the substrate, providing a highest concentration of reaction byproducts proximate the edge of the substrate closest to the exhaust.

Accordingly, in embodiments of the present invention, the apertures 104 and interstices 110, which provide the gas extraction of the disclosed gas injection and extraction apparatus 100, are located above the substrate 410 and adjacent to the tubes 108 which provide the gas injection. In this configuration, the inventor believes a more uniform process is obtained.

The inventor has discovered that by providing the vacuum in such a manner to a processing chamber for processing a substrate, the reaction byproducts may be removed quickly and efficiently from the processing volume thereby reducing or eliminating the above described effect of the reaction byproducts on subsequent reactions near or on the substrate 410. The gas injection and extraction apparatus 100 may be configured in any manner suitable to provide a necessary number of gas injection and extraction locations to perform a desired process and to provide a desired pattern of process gas and reaction byproduct flow to facilitate the above described removal of reaction byproducts.

The above description and figures depict the present gas injection and extraction apparatus 100 with the tubes 108 coupled to the gas supplies 112, 112a and the apertures 104 and interstices 110 coupled with the vacuum source 114 or vacuum sources 114 and 114a. In other embodiments, the tubes 108 may be fluidly coupled to the vacuum sources 114, 114a, and the apertures 104 and interstices 110 may be fluidly coupled with the gas supplies 112, 112a.

Alternatively or in combination to the embodiments disclosed above with respect to FIGS. 1-4, embodiments of the present selective gas injection and extraction apparatus may include a gas injection conduit and an adjacent gas extraction conduit, for use in a processing chamber. As used in the present disclosure, "conduit" is used to mean a pipe, tube, or duct used for conveying a fluid. The conduit may have any suitable cross sectional closed shape for adequately conveying a fluid. Non-limiting exemplary cross sectional shapes include round, oval, or other closed curved shape, as well as polygonal cross sectional shapes. FIGS. 5A-5D are schematic illustrations of embodiments comprising a gas injection conduit and an adjacent gas extraction conduit.

Figure 5A:
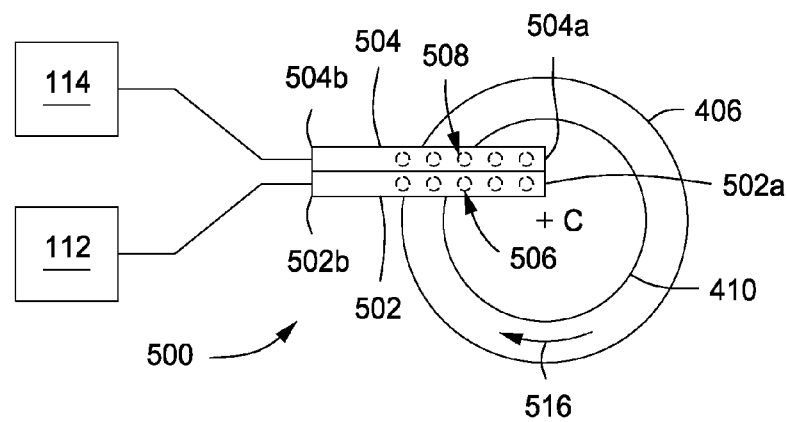
FIGS. 5A-5E respectively depict top views of gas injection and extraction apparatus in accordance with various embodiments of the present invention disposed above a substrate support.

FIG. 5A depicts a first gas injection and extraction apparatus 500 disposed on a first side of a substrate support 406 (e.g., above or opposing the substrate support 406), which may or may not include a substrate 410 disposed on the substrate support. The substrate support may or may not be mounted for rotation about a point on the substrate support surface, for example a center point C. Substrate support 406 and substrate 410 are illustrated as circular in shape for ease or illustration only. The inventive apparatus may be used with substrate supports and/or substrates of other shapes. The first gas injection and extraction apparatus 500 and the substrate support may comprise a process chamber, not shown in FIG. 5, but similar, for example, to the process chamber 400 discussed above with respect to FIG. 4.

First gas injection and extraction apparatus 500 comprises a first elongate gas injection conduit 502 and a first elongate gas extraction conduit 504 adjacent to the gas injection conduit. The conduits 502 and 504 may be separate constructions or may be of unitary construction with fluidly separated conduits. The conduits 502 and 504 are illustrated as similar in size and coterminous for ease of illustration only. The conduits 502 and 504 may have the same or different cross sectional shapes or sizes as convenient. The gas injection conduit 502 may also be longer or shorter than the gas extraction conduit 504. Gas injection conduit first end 502a may be offset from gas extraction conduit first end 504a either extending beyond, or falling short of, gas extraction conduit first end 504a. Similar relationships may exist for gas injection conduit second end 502b and gas extraction conduit second end 504b.

First elongate gas injection conduit 502 may be fluidly coupled to the gas supply 112. In some embodiments, the gas supply 112 supplies one or more gases to gas injection conduit 502 for introduction to an area above the substrate support 406, for example via one or more openings 506, to deliver the one or more gases to the substrate 410, when present. The one or more openings 506 may be distributed along the gas injection conduit 502 as desired (in number, size, pattern, etc.) to provide a desired gas distribution characteristics such as gas flow rate, gas distribution location, gas velocity, or the like First elongate gas extraction conduit 504 may be fluidly coupled to the vacuum source 114, for example a vacuum pump. The vacuum source 114 facilitates local removal of the gases and/or process byproducts, for example via one or more openings 508 disposed in the gas extraction conduit 504. The one or more openings 508 may be similar to the one or more openings 506.

The conduits 502 and 504 of the first gas injection and extraction apparatus 500 may extend from a first point at or beyond the perimeter of substrate support 406 to a point within the perimeter of the substrate support 406 and above the substrate support, i.e., a portion of the first gas injection and extraction apparatus 500 extends over a portion of the substrate support 406. The conduits 502 and 504 may extend over substrate support 406 in any orientation with respect to the substrate support. As a non-limiting example, as illustrated in FIG. 5A, the conduits 502 and 504 of the first gas injection and extraction apparatus 500 extend along a chord of circular substrate support 406. The conduits 502 and 504 may extend along any chord, radius, or diameter, or portion thereof, of a circular substrate support. Similarly, the conduits 502 and 504 of the first gas injection and extraction apparatus 500 may extend over non-circular substrate supports in any orientation, and to any length, with respect to the non-circular substrate support. In some embodiments, the conduits 502, 504 extend at least to a point proximate the center C of the substrate support 406 (and the substrate 410) to provide more uniform process results. For example, in some embodiments, the conduits 502, 504 extend along a radius to the center C, or to a point slightly before or slightly after the center C, or to a point such that the terminal openings of the one or more openings 506, 508 are disposed over or near the center C.

Figure 5B:
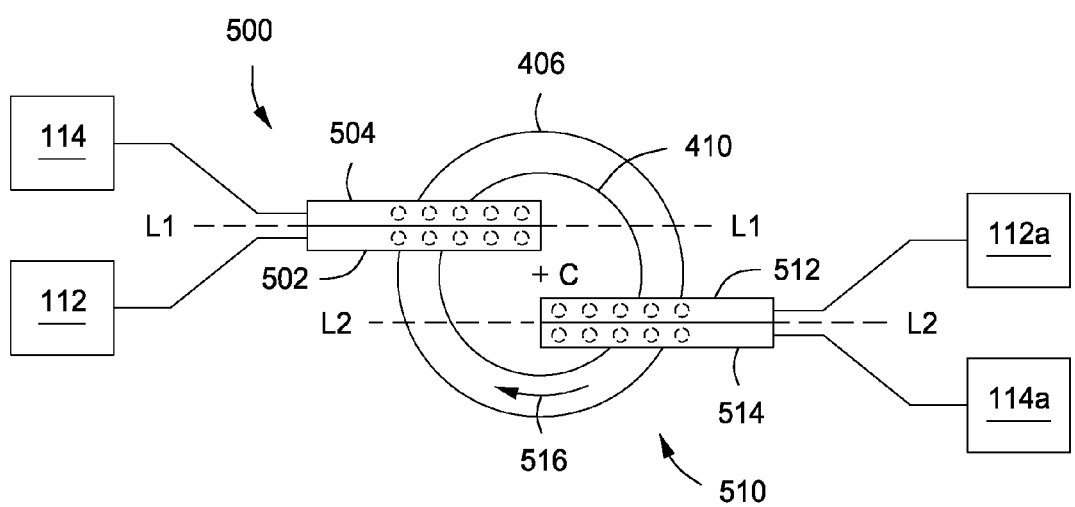
Figure 5C:
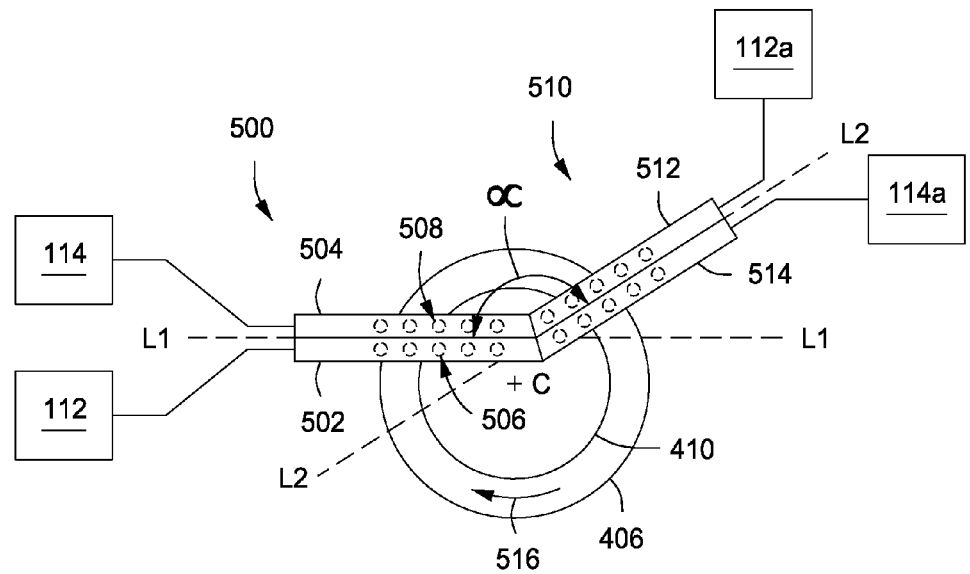
Figure 5D:
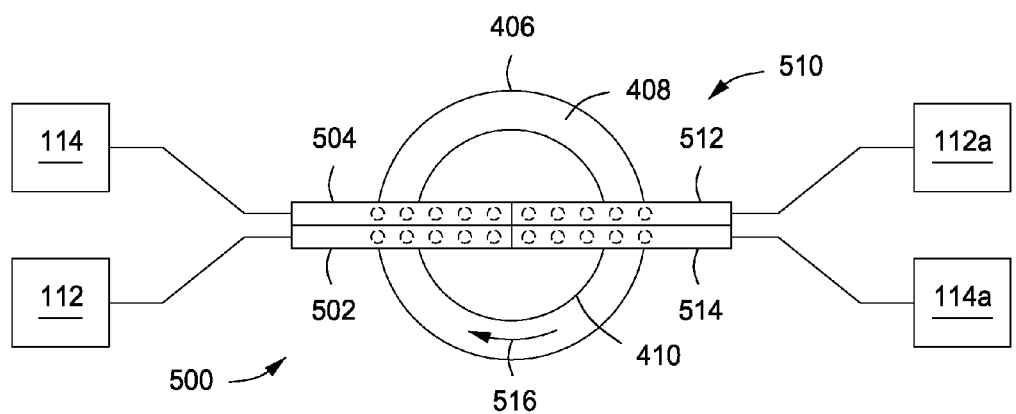

In some embodiments, a second gas injection and extraction apparatus 510, comprising second gas injection conduit 512 and second gas extraction conduit 514, may be used in conjunction with first gas injection and extraction apparatus 500, as illustrated in FIGS. 5B-5D. Second gas injection and extraction apparatus 510 may be of the same, or similar, construction as first gas injection and extraction apparatus 500. Second gas injection and extraction apparatus 510 comprises second gas injection conduit 512 and second gas extraction conduit 514, similar to conduits 502 and 504 described above.

Second gas injection conduit 512 and second gas extraction conduit 514 may be fluidly coupled to gas supply 112a and vacuum source 114a. Gas supply 112a, coupled to second gas injection conduit 512, may provide the same gas as gas supply 112, or may provide a different gas. For example, gas supply 112 may provide a process gas to the first gas injection conduit, conduit 502, and second gas supply 112a may provide a second process gas to second gas injection conduit 514. Alternately, one gas supply may provide a process gas to the conduit to which it is coupled and the other gas supply may provide a purge or inert gas to the similarly coupled conduit. Gas supply 112 may be fluidly coupled to gas supply 112a to provide the same gas to the gas injection conduits, conduits 502 and 512.

Vacuum source 114a may be the same as vacuum source 114 to provide a common vacuum source to extraction conduits, conduits 504 and 514. In alternate embodiments, vacuum source 114 may be separate from vacuum source 114a.

Accordingly, second gas injection conduit 512 and second gas extraction conduit 514 provide the same or substantially the same function as the first gas injection conduit, conduit 502, and the first gas extraction conduit, conduit 504, described above.

Embodiments comprising more than two gas injection and extraction apparatus, for example three or four gas injection and extraction apparatus are contemplated. In embodiments comprising more than two gas injection and extraction apparatus, each apparatus may operate in the same or substantially the same fashion as embodiments comprising one or two gas injection and extraction apparatus.

In FIG. 5B, the conduits 502 and 504 of first gas injection and extraction apparatus 500 extend from a first point at or beyond the perimeter of substrate support 406 to a first point within the perimeter of the substrate support 406 and above the substrate support. The conduits 512 and 514 of second gas injection and extraction apparatus 510 extend from a second point at or beyond the perimeter of substrate support 406 to a second point within the perimeter of the substrate support 406 and above the substrate support. Therefore, portions of the conduits 502, 504 and 512, 514, respectively, of each gas injection and extraction apparatus 500 and 510 extend over a portion of the substrate support 406. In the embodiment illustrated, the conduits 502, 504 and 512, 514 extend along generally parallel spaced apart lines L1 and L2, respectively. The conduits 502, 504, 512, and 514 may be positioned the same distance above substrate support 406, or may be positioned at different distances above the substrate support. L1 and L2 are illustrated as positioned on opposite sides of the center point C. Lines L1 and L2 may also be positioned on the same side of the center point C.

In the embodiment illustrated in FIG. 5C, the conduits 502, 504 and 512, 514 of first and second gas injection and extraction apparatus 500, 510, respectively, extend from points at or beyond the perimeter of the substrate support 406 to points within the perimeter as above. In the illustrated embodiment, first and second gas injection and extraction apparatus 500, 510 extend generally along lines L1 and L2 intersecting at a point above the substrate support 406. One or both of lines L1 and L2 may pass through a center point of the volume above the substrate support 406. Lines L1 and L2 may form any angle α in the range of 0° to 180°. In some embodiments, L1 and L2 may form an angle of about 90°, while in other embodiments the angle α may be about 120° or about 180°.

In embodiments employing two gas injection and extraction apparatus 500 and 510, illustrated for example in FIG. 5D, first gas injection conduit 502, first gas extraction conduit 504, second gas injection conduit 512 and second gas extraction conduit 514, may be arranged as illustrated. As illustrated, first gas injection conduit 502 is generally collinear with second gas extraction conduit 514, and first gas extraction conduit 504 is generally collinear with second gas injection conduit 512. This configuration may provide beneficial results when used with a rotating substrate support 406.

In the configuration illustrated in FIG. 5D with a rotating substrate support 406 as indicated illustratively by arrow 516, an area of the substrate 410 is first exposed to a gas injection from a gas injection conduit 502 (or 512) and subsequently to a gas extraction from the associated gas extraction conduit 504 (or 514). The gas injection and gas extraction are provided from above the substrate support 406 as described above.

In some embodiments, more than two gas injection and extraction apparatus 500 may operate in conjunction with each other. Multiple gas injection and extraction apparatus comprising gas injection conduits (502) and gas extraction conduits (504) may be configured in a process chamber in the processing volume above a substrate support top surface 408. As discussed above in embodiments comprising two gas injection and extraction apparatus 500 and 510, the more than two apparatus may be arranged in any configuration. For example, the more than two apparatus may be equidistantly spaced within the volume above the substrate support 406, or may be concentrated within a specific area over the substrate support.

Figure 5E:
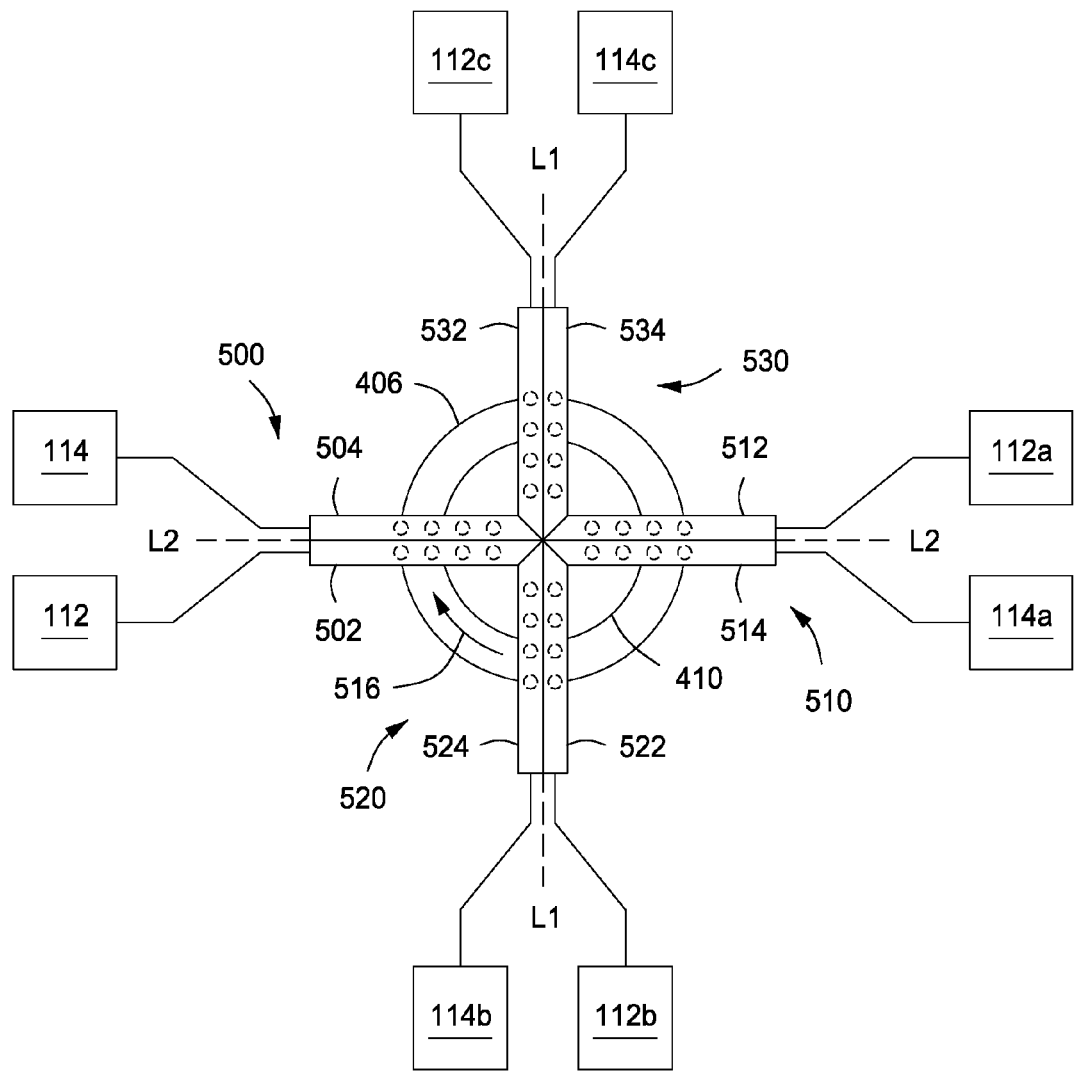

A non-limiting example of an embodiment comprising more than two gas injection and extraction apparatus 500 is illustrated in FIG. 5E. As illustrated, four gas injection and extraction apparatus 500 are spaced substantially evenly about substrate support 406, and substrate 410 if present. As described above, each apparatus comprises gas injection conduit 502 fluidly coupled to gas supply 112 and gas extraction conduit 504 fluidly coupled to vacuum source 114. Conduits 502 and 504 are generally aligned with lines L1 and L2 which generally form an angle α of 90°. Substrate support 406 may be supported in rotation as indicated by arrow 516. With rotation as indicated, an area of substrate support 406, or substrate 410 if present, first encounters a gas injection conduit 502, followed by a gas extraction conduit 504, benefiting from the process uniformity described above.

Each gas injection and extraction apparatus 500 as illustrated in FIG. 5E may provide a different gas. In some embodiments, a process gas is supplied by at least one gas injection conduit 502 and a purge or inert gas is provided by at least one gas injection conduit 502. One or more gas extraction conduits 504 may be fluidly coupled to a common vacuum source, or each gas extraction conduit 504 may be fluidly coupled to a separate vacuum source.

In embodiments comprising multiple gas injection and extraction apparatus 500, the apparatus may be of different configuration. For example, conduits and/or the one or more openings provided in the respective conduits may be of different size, shape, or material for specific operations to provide a desired gas distribution characteristics as discussed above.

The inventor has discovered that by providing gas injection, for example process gas injection, with gas extraction following in the direction of substrate support rotation, the reaction byproducts may be removed quickly and efficiently from the processing volume and from the area above the substrate support. In so doing, the flow of gases, for example process gases, and other substances, for example process byproducts, is substantially perpendicular to the substrate support surface 408.

The inventive gas injection and extraction apparatus 500 advantageously reduces or eliminates the above described effect of the reaction byproducts on subsequent reactions on the substrate 410 when present. The gas injection and extraction apparatus 500 may be configured in any manner suitable to provide a necessary number of gas injection and extraction locations to perform a desired process and to provide a desired pattern of process gas and reaction byproduct flow to facilitate the above described removal of reaction byproducts.

In one illustrative mode of operation, an atomic layer deposition (ALD) process may be carried out using the inventive apparatus. For example, a first gas may be provided by one gas injection and extraction apparatus (e.g., 500) and a second gas may be provided by another of the gas injection and extraction apparatus (e.g., 510). The first gas may be a precursor gas for depositing a material layer on a substrate and may adsorb to the substrate to form a monolayer or layer about an atom thick of the precursor. The second gas may be a reductant gas or other reagent for reacting with the first process gas (e.g., the precursor gas) to form the desired layer comprising the material. As the substrate 410 rotates on the substrate support 406, multiple repetitions of the first and second gas (e.g., precursor gas and reductant gas) interactions may be performed to deposit the material layer to the desired thickness. The exhaust portions of the respective gas injection and extraction apparatus remove the excess first and second gases to limit or prevent unwanted deposition on other chamber components. In some embodiments, for example as shown in FIG. 5E, additional gas injection and extraction apparatus may be provided between the gas injection and extraction apparatus 500 and the second gas injection and extraction apparatus 510 (e.g., third gas injection and extraction apparatus 520 and fourth gas injection and extraction apparatus 530). The third and fourth gas injection and extraction apparatus may provide a purge gas to further limit or prevent undesired interaction between the first and second gases during operation.

Thus, embodiments of gas injection and extraction apparatus for use in processing systems have been provided herein. In some embodiments, the inventive gas injection and extraction apparatus may advantageously provide for quick and efficient removal of process reaction byproducts from a surface of the substrate, thereby reducing or eliminating an effect the reaction byproducts may have on subsequent process reactions.

While the foregoing is directed to embodiments of the present invention, other and further embodiments of the invention may be devised without departing from the basic scope thereof.

The invention claimed is:

1. A process chamber having a gas injection and extraction apparatus, comprising:
 a chamber body enclosing a processing volume and having a substrate support disposed within the processing volume, the substrate support configured to support and rotate a substrate about a central axis of the substrate;
 a first gas injection and extraction apparatus disposed within the chamber body opposite a support surface of the substrate support and extending only partially across the support surface, the first gas injection and extraction apparatus comprising:
  a first linear gas injection tubular conduit extending lengthwise over at least a portion of the support surface of the substrate support; and
  a first linear gas extraction tubular conduit proximate to the first linear gas injection tubular conduit and extending lengthwise over at least a portion of the support. surface of the substrate support, wherein the first linear gas injection tubular conduit and the first linear gas extraction tubular conduit being in a common hemisphere of the support surface of the substrate support;
 a first gas supply fluidly coupled to the first linear gas injection tubular conduit to provide one or more gases to a region proximate to the substrate support; and
 a first vacuum source fluidly coupled to the first linear gas extraction tubular conduit.

2. The process chamber of claim 1, further comprising:
 a second gas injection and extraction apparatus disposed within the chamber body opposite the support surface of the substrate support and extending only partially across the support surface, the second gas injection and extraction apparatus comprising:
  a second linear gas injection tubular conduit extending lengthwise over at least a portion of the support surface of the substrate support; and
  a second linear gas extraction tubular conduit proximate to the second linear gas injection tubular conduit and extending lengthwise over at least a portion of the support surface of the substrate support;
 a second gas supply fluidly coupled to the second linear gas injection tubular conduit to provide one or more gases to a second region proximate to the substrate support; and
 a second vacuum source fluidly coupled to the second linear gas extraction tubular conduit.

3. The process chamber of claim 2, wherein the first linear gas injection and extraction tubular conduits and the second linear gas injection and extraction tubular conduits are not collinear.

4. The process chamber of claim 2, wherein the first linear gas injection and extraction tubular conduits and the second linear gas injection and extraction tubular conduits are collinear.

5. The process chamber of claim 4, wherein the first linear gas injection tubular conduit is collinear with the second linear gas extraction tubular conduit and the second linear gas injection tubular conduit is collinear with the first linear gas extraction tubular conduit.

6. The process chamber of claim 2, wherein the first vacuum source and the second vacuum source are a common vacuum source.

7. The process chamber of claim 2, further comprising:
 a third and a fourth gas injection and extraction apparatus disposed within the chamber body opposite the support surface of the substrate support and extending only partially across the support surface, the third and fourth gas injection and extraction apparatus disposed between the first and second gas injection and extraction apparatus, the third and a fourth gas injection and extraction apparatus respectively comprising:
  a third and a fourth linear gas injection tubular conduit extending lengthwise over at least a portion of the support surface of the substrate support; and
  a third and a fourth linear gas extraction tubular conduit proximate to the respective third and fourth linear gas injection tubular conduits and extending lengthwise over at least a portion of the support surface of the substrate support;
 a third and a fourth gas supply respectively fluidly coupled to the third and fourth linear gas injection tubular conduits to respectively provide one or more gases to a third and a fourth region proximate to the substrate support; and
 a third and a fourth vacuum source respectively fluidly coupled to the third and fourth linear gas extraction tubular conduits.

8. The process chamber of claim 7, wherein the first, second, third, and fourth vacuum sources are a common vacuum source.

9. The process chamber of claim 8, wherein the first and second gas supplies are process gas supplies to deposit a material layer on a substrate and wherein the third and fourth gas supplies are inert gas supplies.

10. The process chamber of claim 1, wherein the substrate support is rotatably disposed within the processing volume.

11. A process chamber having a gas injection and extraction apparatus, comprising:
- a chamber body enclosing a processing volume and having a substrate support disposed within the processing volume, the substrate support configured to support and rotate a substrate about a central axis of the substrate;
- a first gas injection and extraction. apparatus disposed within the: chamber body opposite a support surface of the substrate support and extending only partially across the support surface, the first gas injection and extraction apparatus comprising:
  - a first linear gas injection tubular conduit extending lengthwise over at least a portion of the support surface of the substrate support, wherein the first linear gas injection tubular conduit extends from a first end beyond a perimeter of the substrate support to a point within the perimeter of the substrate support; and
  - a first linear gas extraction tubular conduit proximate to the first linear gas injection tubular conduit and extending lengthwise over at least a portion of the support surface of the substrate support wherein the first linear gas extraction tubular conduit extends from a second end beyond the perimeter of the substrate support to a point within the perimeter of the substrate support, wherein the first linear gas injection tubular conduit and the first linear gas extraction tubular conduit being in a common hemisphere of the support surface of the substrate support;
- a first gas supply, fluidly coupled to the first end of the first linear gas injection tubular conduit to provide one or more gases to a region proximate to the substrate support; and
- a first vacuum source fluidly coupled to the second end of the first linear gas extraction tubular conduit.

12. The process chamber of claim 1, wherein the first linear gas injection tubular conduit is parallel to and spaced apart from the the first linear gas extraction tubular conduit.

13. The process chamber of claim 1, wherein the first linear gas injection tubular conduit and the first linear gas extraction tubular conduit are formed in a single unitary body.

14. The process chamber of claim 12, wherein the first linear gas injection tubular conduit and the first linear gas extraction tubular conduit are parallel to the support surface.

15. The process chamber of claim 11, wherein the first linear gas injection tubular conduit is parallel to and spaced apart from the the first linear gas extraction tubular conduit.

16. The process chamber of claim 1, wherein the first linear gas injection tubular conduit and the first linear gas extraction tubular conduit are positioned at different distances above the substrate support.

17. The process chamber of claim 2, wherein the first gas injection and extraction apparatus and the second gas injection and extraction apparatus are positioned at different distances above the substrate support.

* * * * *

UNITED STATES PATENT AND TRADEMARK OFFICE
CERTIFICATE OF CORRECTION

PATENT NO. : 10,174,422 B2
APPLICATION NO. : 14/052049
DATED : January 8, 2019
INVENTOR(S) : Martin J. Ripley Page 1 of 1

It is certified that error appears in the above-identified patent and that said Letters Patent is hereby corrected as shown below:

In the Claims

In Column 11, Line 58 delete "support. surface" and substitute therefor --support surface--;

In Column 13, Line 10 delete "extraction. apparatus" and substitute therefor --extraction apparatus--;

In Column 13, Line 11 delete "within: the chamber" and substitute therefor --within the chamber--;

In Column 14, Line 4 delete "supply, fluidly" and substitute therefor --supply fluidly--;

In Column 14, Line 11 delete "from the the first" and substitute therefor --from the first--;

In Column 14, Line 21 delete "from the the first" and substitute therefor --from the first--.

Signed and Sealed this
Twenty-sixth Day of March, 2019

Andrei Iancu
*Director of the United States Patent and Trademark Office*